United States Patent
Tsai et al.

(10) Patent No.: US 9,093,468 B2
(45) Date of Patent: Jul. 28, 2015

(54) ASYMMETRIC CYCLIC DEPOSITON AND ETCH PROCESS FOR EPITAXIAL FORMATION MECHANISMS OF SOURCE AND DRAIN REGIONS

(71) Applicant: Taiwan Semiconductor Manufacturing Company, Ltd., Hsin-Chu (TW)

(72) Inventors: Chun Hsiung Tsai, Xinpu Township (TW); Tsan-Yao Chen, Jhubei (TW); Jian-An Ke, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/901,406

(22) Filed: May 23, 2013

(65) Prior Publication Data

US 2014/0264636 A1    Sep. 18, 2014

Related U.S. Application Data

(60) Provisional application No. 61/780,520, filed on Mar. 13, 2013.

(51) Int. Cl.
*H01L 29/66* (2006.01)
*H01L 29/78* (2006.01)

(52) U.S. Cl.
CPC ...... *H01L 29/66636* (2013.01); *H01L 29/7834* (2013.01)

(58) Field of Classification Search
CPC .............. H01L 29/66628; H01L 29/66636; H01L 29/7834; H01L 29/7848
USPC ............................................................ 438/300
See application file for complete search history.

(56) References Cited

U.S. PATENT DOCUMENTS

| | | | |
|---|---|---|---|
| 6,137,149 | A | 10/2000 | Kodama |
| 6,238,989 | B1 | 5/2001 | Huang et al. |
| 7,030,012 | B2 | 4/2006 | Divakaruni et al. |
| 8,053,273 | B2 | 11/2011 | Kammler et al. |
| 2001/0023108 | A1 | 9/2001 | Miyano et al. |
| 2005/0077570 | A1 | 4/2005 | Nishinohara |
| 2006/0084235 | A1 | 4/2006 | Barr et al. |

(Continued)

OTHER PUBLICATIONS

Bauer, M., "High throughput SEG of highly in-situ doped SiCP/SiP layers for NMOS devices using a Si3H8/SiH3CH3/PH3/Cl2 based CDE process," 2012, pp. 499-506, vol. 50, Issue 9, The Electrochemical Society, Prime 2012.

(Continued)

*Primary Examiner* — Richard Booth
(74) *Attorney, Agent, or Firm* — Slater & Matsil, L.L.P.

(57) ABSTRACT

The embodiments of mechanisms for forming source/drain (S/D) regions of field effect transistors (FETs) described uses $Cl_2$ as an etchant during the epitaxial formation of the S/D regions. The mechanisms involve using an asymmetric cyclic deposition and etch (ACDE) process that forms a preparation layer enable epitaxial growth of the following epitaxial layer with transistor dopants. The mechanisms also involve soaking the surface of substrate with dopant-containing precursors to enable sufficient incorporation of transistor dopants during the epitaxial growth of the S/D regions. By using $Cl_2$ as etchants, the mechanisms also enables high throughput of the epitaxial growth of the S/D regions.

20 Claims, 9 Drawing Sheets

(56) References Cited

U.S. PATENT DOCUMENTS

| | | |
|---|---|---|
| 2006/0088968 A1* | 4/2006 | Shin et al. ............... 438/299 |
| 2006/0115933 A1 | 6/2006 | Ye et al. |
| 2006/0234504 A1 | 10/2006 | Bauer et al. |
| 2006/0289902 A1 | 12/2006 | Ping et al. |
| 2007/0259501 A1 | 11/2007 | Xiong et al. |
| 2007/0287272 A1 | 12/2007 | Bauer et al. |
| 2009/0075029 A1 | 3/2009 | Thomas et al. |
| 2009/0267118 A1 | 10/2009 | Chakravarti et al. |
| 2010/0025779 A1 | 2/2010 | Kammler et al. |
| 2011/0117732 A1 | 5/2011 | Bauer et al. |
| 2011/0124169 A1 | 5/2011 | Ye et al. |
| 2011/0212584 A9 | 9/2011 | Chakravarthi et al. |
| 2011/0266617 A1 | 11/2011 | Nakazawa et al. |
| 2011/0269287 A1 | 11/2011 | Tsai et al. |
| 2012/0056245 A1 | 3/2012 | Kang et al. |
| 2012/0181625 A1 | 7/2012 | Kwok et al. |
| 2012/0295421 A1 | 11/2012 | Brabant et al. |
| 2013/0056795 A1 | 3/2013 | Wu et al. |
| 2013/0157431 A1 | 6/2013 | Tsai et al. |
| 2013/0307076 A1 | 11/2013 | Chang et al. |
| 2013/0328126 A1 | 12/2013 | Tsai et al. |
| 2014/0170840 A1 | 6/2014 | Tsai et al. |

OTHER PUBLICATIONS

Fischer, P. R. et al., "Low Temperature Silcore Deposition of Undoped and Doped Silicon Films," 2006, pp. 203-215, vol. 3, Issue 2, ECS Transactions.

Ishii, Masato, et al., "NMOS Epitaxy-Defect Free and Low Resistivity Films," 2012 International Silicon-Germanium Technology and Device Meeting (ISTDM), IEEE, Jun. 4-6, 2012, 2 pages.

Loubet, N. et al., "Optimization of SiC:P. Raised Source Drain Epitaxy for Planar 20nm Fully Depleted SOI MOSFET Structures," Abstract #3169, Honolulu Prime 2012, The Electrochemical Society, 1 page.

* cited by examiner

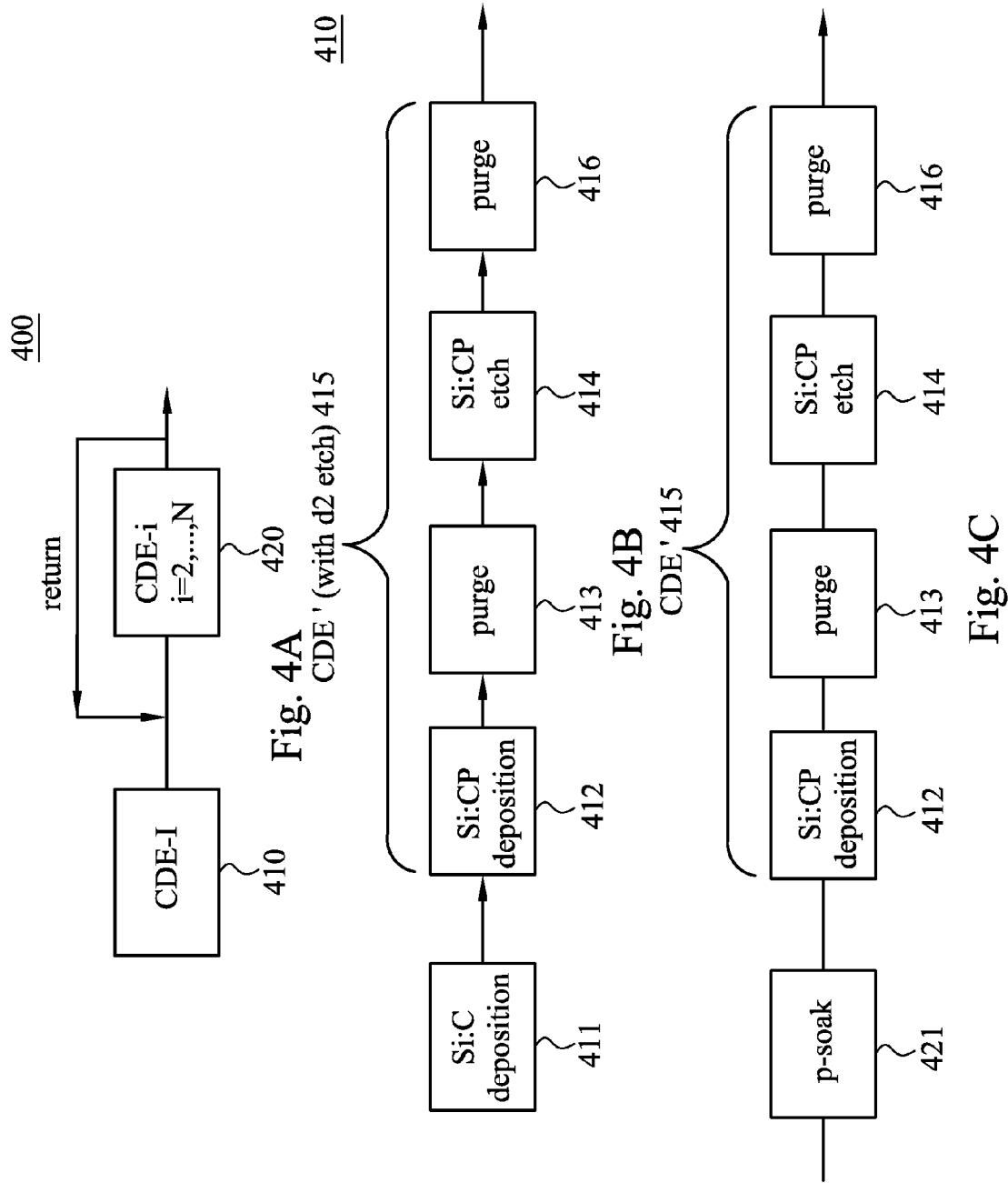

ASYMMETRIC CYCLIC DEPOSITON AND ETCH PROCESS FOR EPITAXIAL FORMATION MECHANISMS OF SOURCE AND DRAIN REGIONS

CROSS-REFERENCES TO RELATED APPLICATIONS

The present application claims priority to U.S. Provisional Patent Application No. 61/780,520, filed Mar. 13, 2013, and entitled "CVD Epitaxy Technique and Device", which application is incorporated herein by reference.

The present application is related to U.S. application Ser. No. 13/493,626, entitled "EPITAXIAL FORMATION OF SOURCE AND DRAIN REGIONS" filed on Jun. 11, 2012. The present application is also related to U.S. application Ser. No. 13/739,781, entitled "Epitaxial Formation Mechanisms of Source and Drain Regions" filed on Jan. 11, 2013. The present application is further related to U.S. Patent application No. 61/780,784, titled "Mechanisms for Doping Lightly-Doped-Drain (LDD) Regions of FinFET Devices" and filed on Mar. 13, 2013. The above-mentioned applications are incorporated herein by reference in their entireties.

TECHNICAL FIELD

The present disclosure relates generally to the field of semiconductor devices and, more particularly, to integrated circuits and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

FIG. 4A shows a schematic diagram of an asymmetric CDE (ACDE) process, in accordance with some embodiments.

FIG. 4B shows a schematic diagram of a first portion of the ACDE process of FIG. 4A, in accordance with some embodiments.

FIG. 4C shows a schematic diagram of a cyclic portion of the ACDE process of FIG. 4A, in accordance with some embodiments.

DETAILED DESCRIPTION

Figure 1:
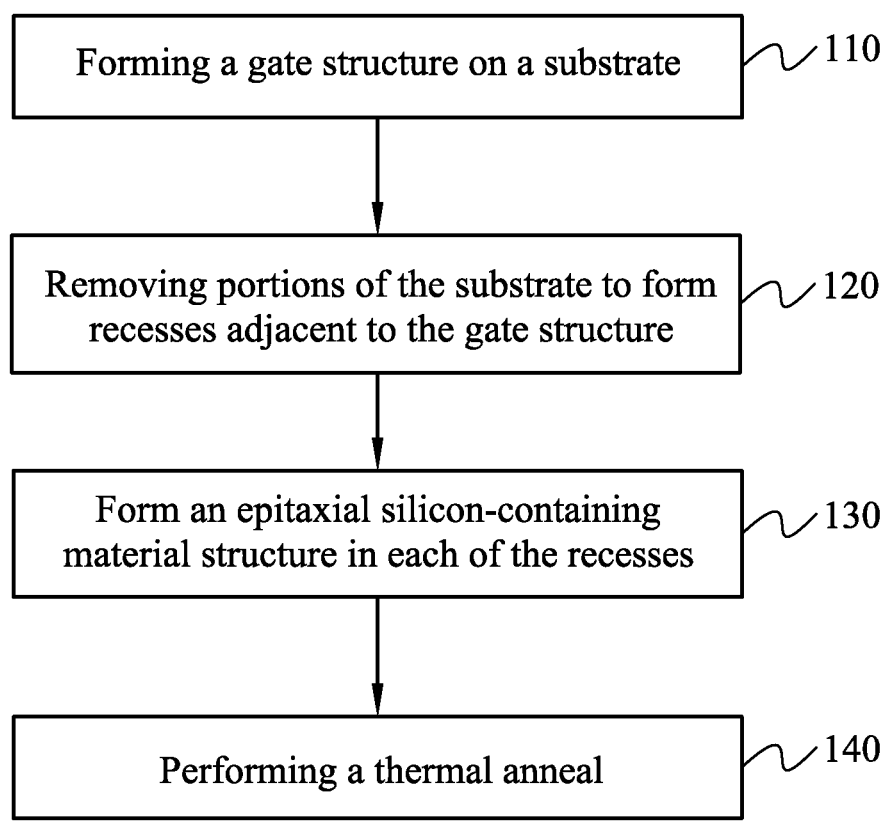
FIG. 1 is a flowchart illustrating a method of forming an integrated circuit, in accordance with some embodiments.

It is understood that the following descriptions provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

As semiconductor devices, such as metal-oxide-semiconductor field effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often epitaxially grows silicon (Si) to form raised source and drain features for an n-type device, and epitaxially grows silicon germanium (SiGe) to form raised source and drain features for a p-type device. Various techniques directed at shapes, configurations, and materials of these source and drain features have been implemented to further improve transistor device performance. Although existing approaches have been generally adequate for their intended purposes, they have not been entirely satisfactory in all respects.

The embodiments will be described with respect to specific embodiments in a specific context, namely a source/drain region for a complementary metal-oxide semiconductor (CMOS) transistor. The embodiments may also be applied, however, to other doped regions within a semiconductor device.

Illustrated in FIG. 1 is a flowchart of a method of forming an integrated circuit, in accordance with some embodiments. FIGS. 2A-2E are schematic cross-sectional views of an integrated circuit during various fabrication stages, in accordance with some embodiments. The integrated circuit may include various passive and active microelectronic devices, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, or other types of transistors. It is understood that FIGS. 2A-2E have been simplified for a better understanding of the concepts of the present disclosure. Accordingly, it should be noted that additional processes may be provided before, during, and after the method 100 of FIG. 1, and that some other processes may only be briefly described herein.

Referring now to FIG. 1, the method 100 can include forming a gate structure over a substrate (block 110). The method 100 can include removing portions of the substrate to form recesses adjacent to the gate structure (block 120). The method 100 can also include forming a silicon-containing material structure in each of the recesses (block 130).

The method 100 further includes an anneal operation 140 after operation 130, in some embodiments. The anneal operation 140 could be used to activate dopants. In some embodiments, the anneal operation 140 also serve to drive dopants into the lightly-doped-drain (LDD) regions.

Figure 2A:
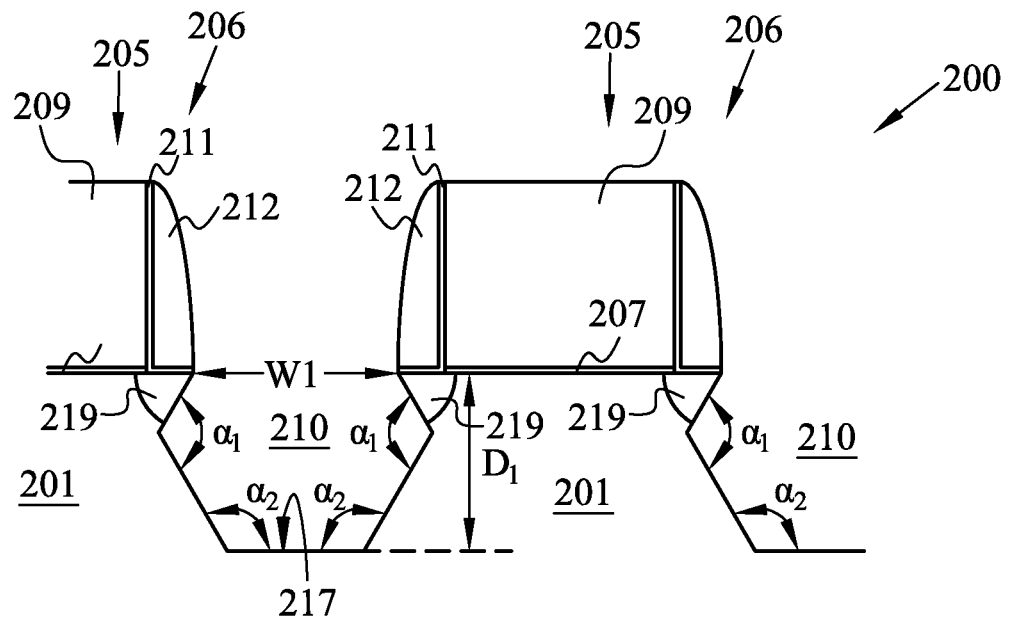
FIGS. 2A-2E are cross-sectional views of an integrated circuit during various fabrication stages, in accordance with some embodiments.

Referring now to FIGS. 2A-2E in conjunction with FIG. 1, an integrated circuit 200 can be fabricated in accordance with the method 100 of FIG. 1. In FIG. 2A, the integrated circuit 200 can be built on a substrate 201. Substrate 201 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Substrate 201 may include an epitaxial layer (epi layer), and may be strained for performance enhancement.

In some embodiments forming n-type transistors, the substrate 201 can be a silicon substrate doped with a p-type dopant, such as boron (resulting in a p-type substrate). A metal gate structure can have a stack structure including a high dielectric constant gate layer, a diffusion barrier layer, a metal work function layer, a metallic layer, and/or other suitable layers. A dummy gate structure can have a stack structure including a dummy material layer, a hard mask layer, and/or other suitable layers.

In some embodiments, a gate structure 206 comprising a gate dielectric 207, a gate electrode 209, first spacers 211, and second spacers 212 may be formed over the substrate 201. The gate dielectric layer 207 includes a dielectric material, such as silicon oxide, silicon oxynitride, silicon nitride, a high-k dielectric material, or combinations thereof. Exemplary high-k dielectric materials include hafnium oxide ($HfO_2$), aluminum oxide ($Al_2O_3$), zirconium oxide ($ZrO_2$), gallium oxide ($Ga_2O_3$), titanium oxide ($TiO_2$), lanthanum oxide ($La_2O_3$), tantalum oxide ($Ta_2O_5$), gadolinium oxide ($Gd_2O_3$), yttrium oxide ($Y_2O_3$), hafnium dioxide-alumina ($HfO_2$—$Al_2O_3$) alloy, hafnium aluminum oxide (HfAlO), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), titanium aluminum oxide (TiAlO), lanthanum aluminum oxide (such as $LaAlO_3$), other high-k dielectric material, or combinations thereof. The gate dielectric layer 207 may include a multilayer structure. For example, the gate dielectric layer 207 may include an interfacial layer formed over the substrate 201, and a high-k dielectric layer formed over the interfacial layer. The interfacial layer may be a silicon oxide layer formed by a thermal process or ALD process.

The gate electrode layer 209 is disposed over the gate dielectric layer 207. The gate electrode layer 209 includes a conductive material, such as polycrystalline silicon (polysilicon), aluminum (Al), copper (Cu), titanium (Ti), tantalum (Ta), tungsten (W), molybdenum (Mo), platinum (Pt), tantalum nitride (TaN), titanium nitride (TiN), tungsten nitride (WN), titanium aluminum (TiAl), titanium aluminum nitride (TiAN), TaCN, TaC, TaSiN, other conductive material, or combinations thereof. The conductive material of the gate electrode layer 209 may be doped or undoped depending on design requirements of field effect transistor devices of integrated circuit 200. In some embodiments, the gate electrode layer 209 includes a work function layer tuned to have a proper work function for enhanced performance of the field effect transistor devices of integrated circuit 200. For example, in the depicted embodiment, where the field effect transistor devices are NFETs, the work function layer includes an n-type work function metal (n-metal), such as Ta, TiAl, TiAlN, TaCN, other n-type work function metal, or a combination thereof. Where the field effect transistor device is a PFET, the work function layer includes a p-type work function metal (p-metal), such as TiN, TaN, other p-type work function metal, or combination thereof. In furtherance of the present example, a conductive layer, such as an aluminum layer, is formed over the work function layer, such that the gate electrode layer 209 includes a work function layer disposed over the gate dielectric layer 207 and a conductive layer disposed over the work function layer.

Surrounding the gate stack 205 are the first spacers 211 and the second spacers 212. The gate stack 205 and the surrounding spacers, such as spacers 211 and 212, form a gate structure 206. The spacer layers may comprise SiN, oxynitride, SiC, SiON, oxide, and the like. However, as one of ordinary skill in the art will recognize, the first spacers 211 and the second spacers 212 as illustrated in FIG. 2A are intended to be merely illustrative and are not intended to limit the embodiments to these descriptions. Rather, any suitable number and combination of spacer layers and shapes may be utilized in order to form spacers for the gate stack 205, and any suitable combination of spacers may alternatively be utilized.

In some embodiments of forming an n-type transistor, n-type lightly-doped drains (LDDs) 219 can be formed in the substrate 201. Portions of the n-type LDDs 219 can be formed under the gate structure 205. The n-type LDDs 219 can be formed of n-type dopants (impurities). For example, the dopants can comprise phosphorous, arsenic, and/or other group V elements. In some embodiments, at least one thermal annealing process, e.g., a rapid thermal annealing (RTA) process, can be performed to activate the dopants of the n-type LDDs 219. In some embodiments of forming an n-type transistor, p-type pocket doped regions (not shown) can be formed in the substrate 201. The p-type pocket doped regions can be formed of p-type dopants (impurities). For example, the dopants can comprise boron and/or other group III elements.

FIG. 2A illustrates the formation of recesses 210 within the substrate 201. The recesses 210 may be formed using, e.g., a wet etch process selective to the material of the substrate 201 and uses the gate stack 205, the first spacers 211, and the second spacers 212 as a hard mask in order to form the recesses 210. For example, an etchant such as carbon tetrafluoride ($CF_4$), HF, tetramethylammonium hydroxide (TMAH), or combinations of thereof, or the like may be used to perform the wet etch and form the recesses 210. The recesses 210 provide an opening in the substrate 201 into which source/drain regions (whose formation is described further below with respect to FIGS. 2B-2E) will subsequently be formed.

Recess 210, formed below and between a spacer 212 surrounding gate structure 205 and a neighboring spacer 212 as shown in FIG. 2A, has a width $W_1$ of between about 50 Å and about 500 Å, in accordance with some embodiments. Recesses 210 may additionally undercut the first spacers 211 and/or the second spacers 212. Additionally, the wet etch process may be continued until the recesses 210 have a depth $D_1$ from a surface of the substrate 201. In some embodiments, $D_1$ is in a range from about 50 Å and about 600 Å. However, these dimensions are not intended to limit the present embodiments, as any suitable dimensions for the recesses 210 may alternatively be utilized.

The recesses 210 may be formed to have either an angular or rounded shape. In an embodiment in which the recesses 210 have an angular shape, the recesses 210 may be formed to have a first angle $\alpha_1$ along with top of the recesses 210 and a second angle $\alpha_2$ along the bottom of the recesses 210. In some embodiments, the first angle $\alpha_1$ is in a range from about 90° and about 180°. The second angle $\alpha_2$ is in a range from about 85° and about 170°, in accordance with some embodiments. The surface of a recess 210 is noted as 217 in FIG. 2A.

Referring to FIGS. 1 and 2B-2E, the method 100 can include forming an epitaxial silicon-containing material structure in each of the recesses (block 130). In some embodiments, the block 130 can include performing an epitaxial deposition/partial etch process and repeating the epitaxial deposition/partial etch process at least once. Such repeated deposition/partial etch process is also called a cyclic deposition/etch (CDE) process.

Figure 2B:
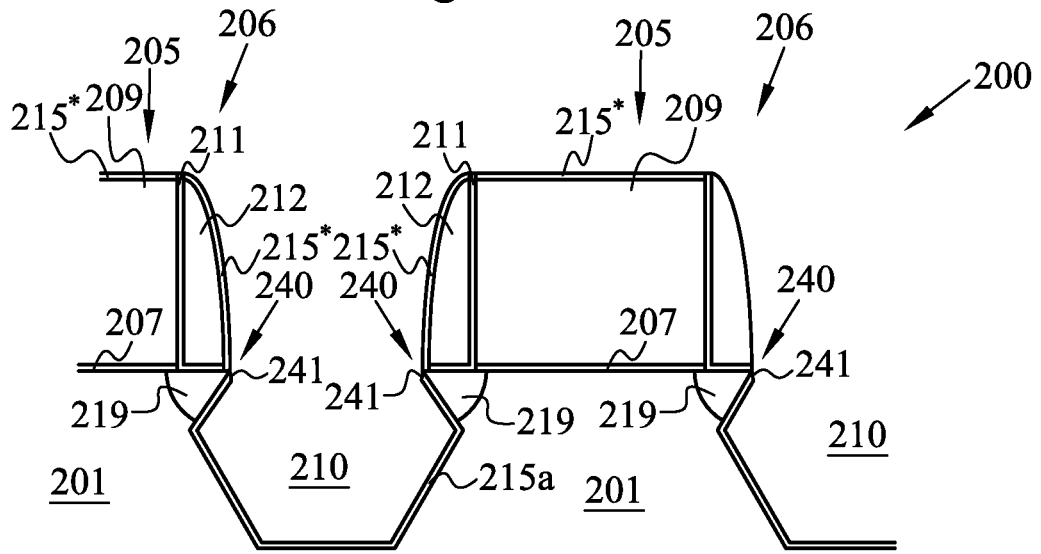
Figure 2C:
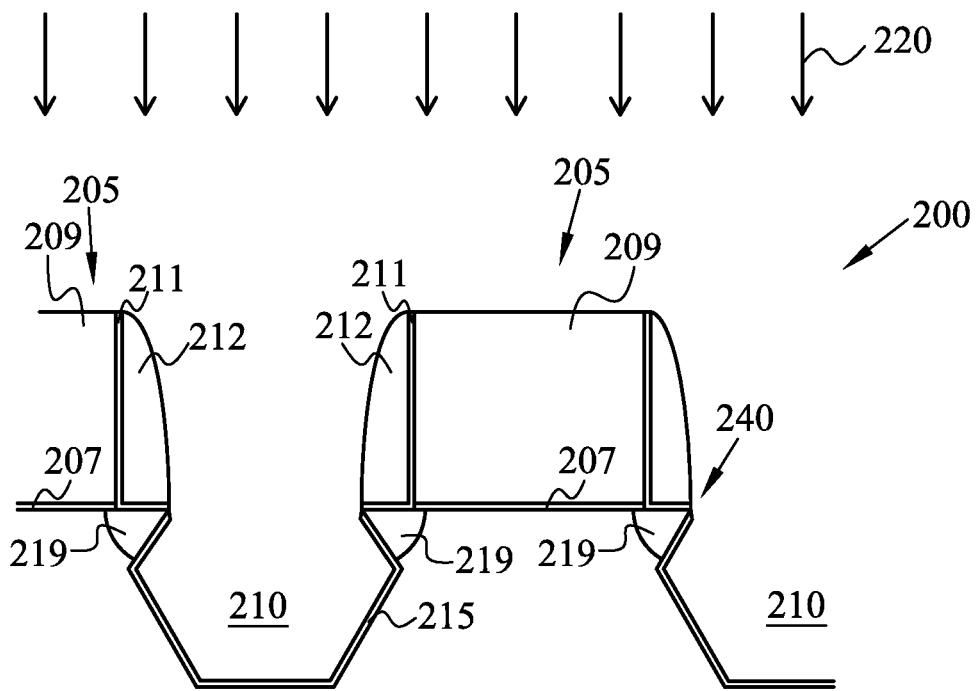
Figure 2D:
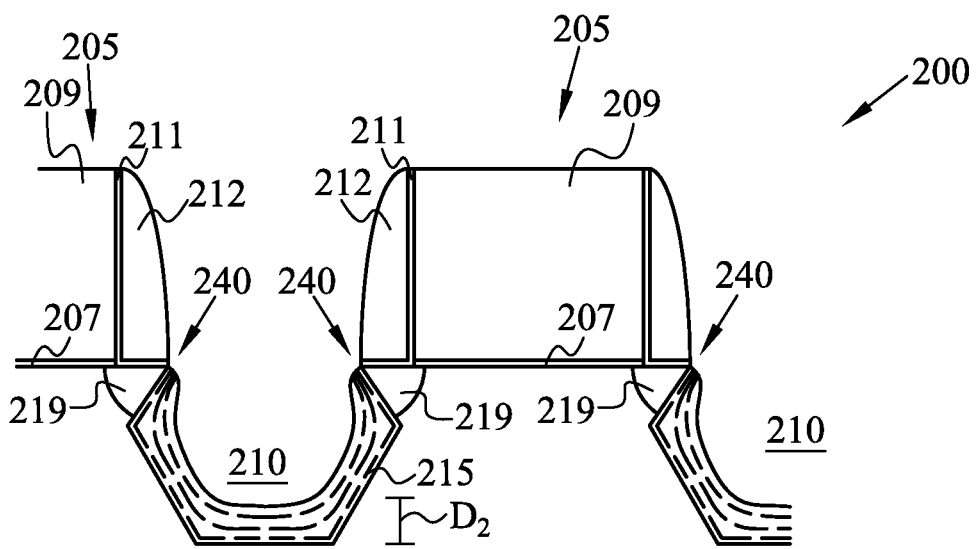
Figure 2E:
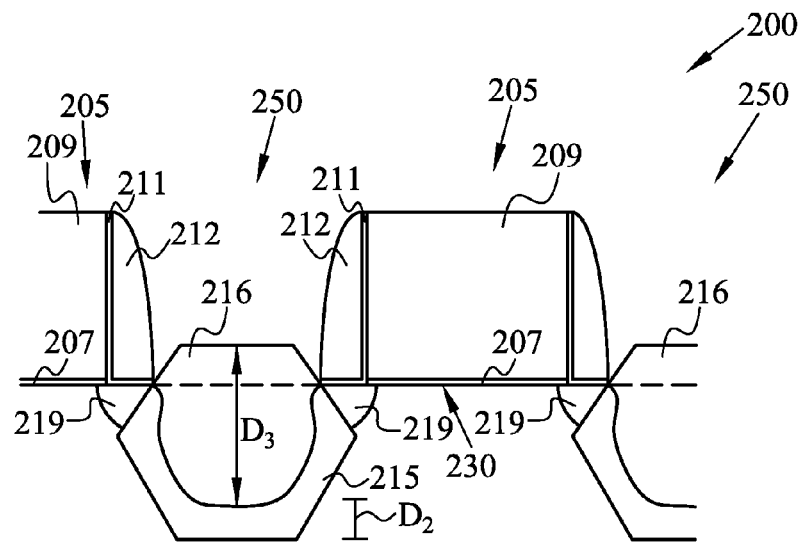

The block 130 may include epitaxially depositing a silicon-containing material (or layer) 215, in recesses 210 as shown in FIGS. 2B-2D, in accordance with some embodiments. Block 130 also may include depositing a silicon-containing layer 216 over the silicon-containing material 215 in recesses 210, as shown in FIG. 2E, in accordance with some embodiments.

The deposition of the silicon-containing material 215 includes in-situ doping the silicon-containing material 215, in accordance with some embodiments. For example, forming an n-type transistor can use an n-type doping precursor, e.g., phosphine ($PH_3$) and/or other n-type doping precursor. By using the in-situ doping process, the dopant profile of the silicon-containing material 215 can be desirably achieved. In some embodiments, the silicon-containing material 215 can be an n-type doped silicon layer that is doped with phosphorus (Si:P). In some embodiments, the silicon-containing material 215 can be an n-type doped silicon layer that is doped with both phosphorus and carbon (Si:CP). Carbon could impede the out-diffusion of phosphorus from the silicon-containing material 215. Other types of dopants may also be included. In some embodiments, the phosphorus dopant has a concentration in a range from about 1E20 atoms/$cm^3$ to about 5E20 atoms/$cm^3$. In some embodiments, the carbon dopant has a concentration in a range from about 0.1% to about 5% (atomic percent).

In some embodiments, the silicon-containing material 215 can be formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof. In some embodiments, the deposition of the silicon-containing material 215 can have a deposition temperature of about 750° C. or less. In other embodiments, the deposition temperature ranges from about 400° C. to about 620° C. The pressure of the deposition process is in a range from about 5 Torr to about 300 Torr, in accordance with some embodiments.

The deposition of the silicon-containing material 215 can use at least one silicon-containing precursor, such as silane ($SiH_4$), disilane ($Si_2H_6$), trisilane ($Si_3H_8$), Dichlorosilane ($SiH_2Cl_2$), another silicon-containing precursor, and/or any combinations thereof. In some embodiments, the silicon-containing precursor can have a flow rate ranging from about 20 standard cubic centimeters per minute (sccm) to about 500 sccm. In other embodiments forming a p-type transistor, the silicon-containing material 215 can be made of at least one material, such as silicon, silicon germanium, other semiconductor materials, and/or any combinations thereof.

As mentioned above, the deposition of the silicon-containing material 215 includes in-situ doping the silicon-containing material 215, in accordance with some embodiments. For example, forming an n-type transistor can use an n-type doping precursor, e.g., phosphorous-containing gases such as phosphine ($PH_3$), arsenic-containing gases such as arsine ($AsH_3$), other n-type dopant-containing gases, or a combination thereof. In some embodiments, the n-type doping precursor can have a flow rate ranging from about 20 sccm to about 500 sccm. A carbon-containing gas, such as monomethylsilane (MMS), is also included to dope the silicon-containing material 215 with carbon, in accordance with some embodiments. In some embodiments, the carbon-containing gas has a flow rate ranging from about 10 sccm to about 600 sccm.

The silicon-containing material 215 in recesses 210 is epitaxial. The deposition process forms a thin epitaxial layer 215a of silicon-containing material in recesses 210 and an amorphous silicon-containing material 215* on gate electrode 209 and spacers 212, as shown in FIG. 2B in accordance with some embodiments. Referring to FIG. 2C, an etching (or partial etching) process 220 removes the amorphous silicon-containing material 215* and also a portion of the silicon-containing material 215a in recesses 210. The remaining silicon-containing material 215 is formed in each of the recesses 210. In some embodiments, the etching process 220 can use an etching gas including at least one of hydrogen chloride (HCl), chlorine ($Cl_2$), germanium hydride ($GeH_4$), other suitable etching gases, and/or any combinations thereof. The flow rate of the etching gas can range from about 50 sccm to about 750 sccm, in accordance with some embodiments. In some embodiments, the pressure of the etching process 220 ranges from about 5 Torr to about 300 Torr. In some embodiments, the etching process 220 can have an etching temperature of about 590° C. or less. In other embodiments, the etching temperature can range from about 400° C. to about 620° C. The process temperatures and pressures for the deposition process and etch process to form the silicon-containing material 215 are identical in some embodiments.

The etching process 220 would remove the amorphous silicon-containing material 215* over non-crystalline surface at a rate higher than the removal rate of epitaxial silicon-containing material 215. In addition, the etching process would remove a portion of epitaxial silicon-containing material 215 including the dislocations 241 near the gate corners 240.

The epitaxial deposition/partial etch process is repeated a number of times until a desired thickness $D_2$ is reached, as shown in FIG. 2D in accordance with some embodiments. As a result, such repeated deposition/partial etch process is called a cyclic deposition/etch (CDE) process. In some embodiments, $D_2$ is in a range from about 10 Å and about 500 Å. The dotted lines in recesses 210 are used to illustrate the multiple sub-layers formed by the epitaxial CDE process.

As mentioned above, the silicon-containing material 215 can be an n-type doped silicon layer that is doped with both phosphorus and carbon, in accordance with some embodiments. Carbon could impede the out-diffusion of phosphorus from the silicon-containing material 215. The phosphorus- and carbon-doped silicon layer can be referred to as a Si:CP layer. The dopants in the silicon-containing material 215 deposited by CDE have higher level of activation than implanted dopants. In some embodiments, the dopant activation level is in a range from about 1E20 atoms/cm$^3$ to about 7E20 atoms/cm$^3$. In contrast, the activation of implanted dopant at S/D is typically at about 1E20 to 2E20 atoms/cm$^3$ level. The higher activation level makes formation of in-situ doping of epitaxial grown silicon-containing desirable.

Following the CDE process, a selective epitaxial growth (SEG) process may be used to deposit additional silicon-containing film to fill the remaining recesses 210. The SEG process has a higher growth rate than the CDE process, in accordance with some embodiments. The SEG process is a selective deposition process and the silicon-containing film formed by this process deposits on epitaxial silicon-containing film, such as layer 215. SEG processes utilize simultaneous deposition and etch. In some embodiments, the surface of the silicon-containing layer 216, which is epitaxial, is leveled with silicon substrate surface 230. In some embodiments, the surface of the silicon-containing layer 216 is above silicon substrate surface 230, as shown in FIG. 2E. The thickness $D_3$ of the silicon-containing layer 216 is in a range from about 30 Å to about 400 Å, in some embodiments. In some embodiments, the silicon-containing layer 216 is doped with phosphorus (Si:P).

Layer 215 and layer 216 form the S/D regions 250. In some embodiments, the material and/or method of forming the silicon-containing layer 216 can be as same as or similar to those of the silicon-containing material 215. In some embodiments, the silicon-containing layer 216 may have a dopant concentration different from that of the silicon-containing material 215.

Figure 3:
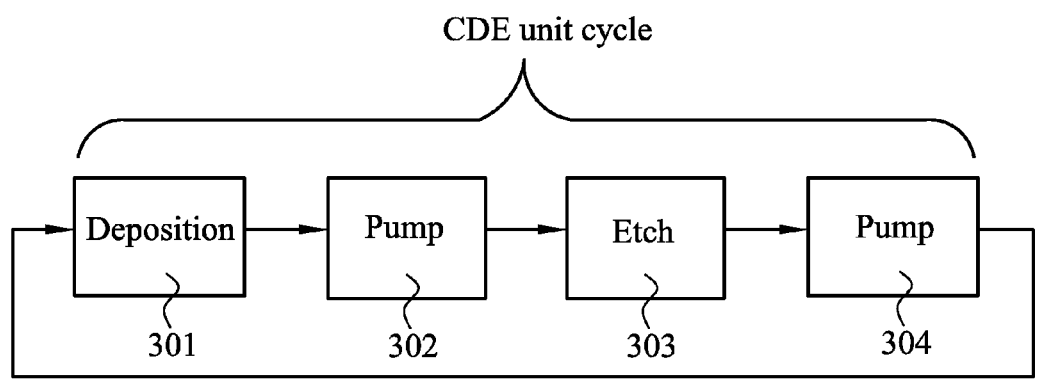
FIG. 3 is a process sequence of a CDE (cyclic deposition/etch) process in a process chamber, in accordance with some embodiments.

As mentioned above, the process to form the silicon-containing material 215 is a CDE process, which involves cyclic deposition and etch processes. FIG. 3 shows the process sequence of a CDE process 300 in a process chamber, in accordance with some embodiments. The process 300 include a deposition operation 301, a post-deposition pump operation 302, a partial-etch operation 303, and a post-etch pump operation 304, in accordance with some embodiments. The CDE process occurs in a process chamber. As mentioned above, the deposition operation 201 employs a silicon-containing gas, such as trisilane ($Si_3H_8$), di-silane ($Si_2H_6$), etc., as silicon source, and a dopant gas, such as $PH_3$, is also used to provide a dopant for the deposited silicon-containing material layer. In some embodiments, the pressure of the deposition process 220 ranges from about 5 Torr to about 300 Torr. In some embodiments, the deposition temperature can range from about 400° C. to about 620° C. In some embodiments, the deposition time is in a range from about 3 seconds to about 20 seconds. In some embodiments, the amount of the silicon-containing material 215 deposited in operation 301 is in a range from about 15 Å to about 80 Å during each CDE unit cycle, in accordance with some embodiments.

After deposition operation 301, a post-deposition purge operation 302 is used to remove the deposition gas from the process chamber. Once the chamber is removed of the deposition gases, the etch operation 303 follows. In some embodiments, the etch operation 303 employs HCl gas and $GeH_4$ gas. A non-reactive carrier gas, such as an inert gas, or $N_2$, is also used in the etch gas mixture in accordance with some embodiments. HCl and $GeH_4$ react with silicon to etch silicon. In some embodiments, $GeH_4$ acts as an etching catalyst to react with silicon to form SiGe, which is then removed by HCl.

After the etching operation 303, the purge operation 304 follows to remove the etching gases used in operation 303 from the chamber. The etch time is in a range from about 40 seconds to about 200 seconds, in some embodiments. The amount of the silicon-containing material 215 removed in operation 303 is in a range from about 5 Å and about 30 Å during each CDE unit cycle, in accordance with some embodiments.

Using a CDE process with constant temperature (isothermal) and the same process pressure (isobaric) during deposition and etch operations has the advantage of good process control and chamber matching. In each CDE unit cycle, a net thickness in a range from about 10 Å and about 40 Å is formed in a unit cycle in accordance with some embodiments. After operation 304, the process sequence involving operations 301, 302, 303, and 304 repeat again until the targeted thickness $D_2$ of silicon-containing material 215 is reached. Detailed description of the CDE process is provided in U.S. application Ser. No. 13/493,626, entitled "EPITAXIAL FORMATION OF SOURCE AND DRAIN REGIONS" filed on Jun. 11, 2012.

In the CDE process described above, $GeH_4$ is used in the etching gas mixture as an etch catalyst. However, the Ge (germanium) in the $GeH_4$ could be incorporated in the silicon-containing material 215 unintentionally. The Ge incorporated in the silicon-containing material 215 could result in increase in resistivity of silicon-containing material 215. For advanced technology nodes, such as N20 and beyond, such increase of resistivity is unacceptable because of its negative effects on Ion (on current) and device performance. In addition, in order to keep the process temperature constant during the each CDE unit cycle, the etching time could be undesirably long due to relatively low etch rate of HCl at a process temperature ideal for depositing the epitaxial and silicon-containing material 215, but less ideal for etching. An alternative process for forming the epitaxial and silicon-containing material 215 with higher etch rate would be desirable to increase throughput.

$Cl_2$ is more reactive than HCl in etching the epitaxial and amorphous silicon-containing materials. Using $Cl_2$ as an etchant would enable reduction of etching time (or etch time). However, there are other factors to be considered for the new process. Advanced semiconductor devices demand lower resistivity in the source and drain regions than less-advanced devices. For example, the resistivity of the epitaxial and silicon-containing material 215 could have a specification of equal to or less than about 0.6 mΩcm. As mentioned above, the silicon-containing material 215 is an n-type doped silicon layer that is doped with both phosphorus and carbon (Si:CP), in some embodiments. To achieve low resistivity, sufficient amount of dopants (i.e. P) is needed in silicon-containing material 215. The higher the amount of active dopants is in material 215, the lower the resistivity of material 215 is. In some embodiments, the dopant concentration is in a range from about 2E20 atoms/cm$^3$ to about 6E20 atoms/cm$^3$.

In addition, carbon is noted above to impede the out-diffusion of phosphorus from the silicon-containing material 215. The concentration of carbon cannot be too low. In some embodiments, the carbon concentration of material 215 is equal to or greater than about 1.2% to about 2.2%. In some embodiments, the carbon concentration of material 215 is in a range from about 1.2% to about 2.2%. The new process is aimed to have good throughput (via higher etching rate) and to meet the goals of lower resistivity and sufficient carbon concentration. For the following discussion, an n-type doped silicon layer that is doped with both phosphorus and carbon (Si:CP) is used as an example of silicon-containing material 215.

FIG. 4A shows a schematic diagram of an asymmetric CDE (ACDE) process 400, in accordance with some embodiments. The ACDE process 400 does not use GeH$_4$ during etching and uses Cl$_2$ as a main etchant. ACDE process 400 begins with a first CDE unit cycle (or CDE-1) 410, which is followed by a following CDE unit cycle (or CDE-i) 420. The following CDE unit cycle (CDE-i) repeats a number of times until a final thickness of epitaxial and silicon-containing material 215 is reached. i=2, . . . , N. N is an integer number and is equal to or greater than 3. The first CDE unit cycle (or CDE-1) 410 is different from the following CDE unit cycle (or CDE-i) 420 (where i=2, . . . , N). The purpose of the first CDE unit cycle (CDE-1) is to prepare the post-etch surfaces 217 of recesses 210 (see FIG. 2A) for further formation of silicon-containing material 215, which is Si:CP for the embodiments described.

Figure 5A:
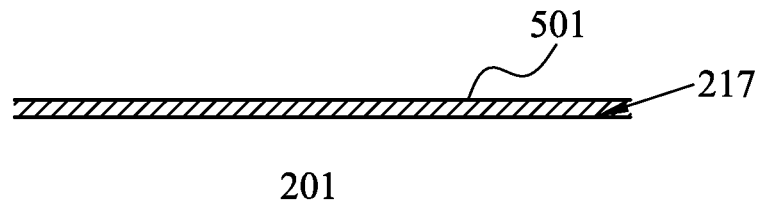
FIGS. 5A-5E show cross-sectional views of a sequential process flow of forming an epitaxial material, in accordance with some embodiments.

FIG. 4B shows CDE-1 410 starts with a Si:C deposition operation 411, which is followed by a Si:CP deposition by a CDE' unit cycle 415. At operation 411, a thin preparation layer 501 of carbon-doped silicon (Si:C) film is epitaxially deposited on surfaces 217 of recesses 210, as shown in FIG. 5A in accordance. FIG. 5A shows an enlarged surface area of recess 210 of FIG. 2A. The etching process(es) used to form recesses 210 creates irregularities on surfaces 217. Carbon is similar to Si in structure and size, in comparison to P to Si. It's easier to form an epitaxial Si:C film than an epitaxial Si:CP film, which include both dopants C and P, on a post-etch surface 217. A thin layer 501 of Si:C film deposited on surface 217 repairs the irregularities and prepares the surfaces of recesses 210 for formation of epitaxial Si:CP. In some embodiments, the thickness of Si:C layer 501 is in a range from about 1 nm to about 5 nm. In some embodiments, the deposition time for this operation is in a range from about 1 second to about 10 seconds. The thickness of the Si:C 501 is relatively thin to allow P dopants deposited in the following process sequence to diffuse into the Si:C 501 layer by thermal anneal to become Si:CP film.

During operation 411, one silicon-containing precursor (or source gas), such as silane (SiH$_4$), disilane (Si$_2$H$_6$), trisilane (Si$_3$H$_8$), Dichlorosilane (SiH$_2$Cl$_2$), etc., and a carbon-containing precursor, such as MMS are used as reactants. A carrier gas, such as an inert gas, or a gas non-reactive with the reactants, may be used. The examples of carrier gas used include, but are not limited to, He, Ar, Ne, Xe, and N$_2$.

Figure 5B:
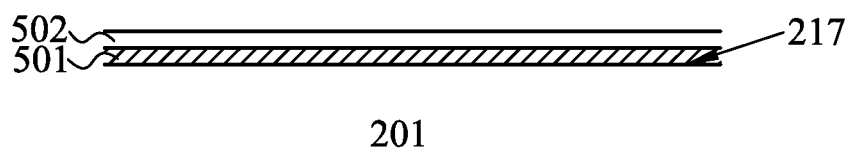

After the thin layer 401 of Si:C film is deposited, the CDE' unit cycle 415 starts. CDE' unit cycle 415 resembles the CDE unit cycle of FIG. 3A described above. The operations 412 (deposition), 413 (purge), 414 (etch), and 416 (purge) resembles operations 301, 302, 303, and 304 of FIG. 3A respectively. In addition to the silicon-containing precursor and the carbon-containing precursor used in the operation 411, a phosphorus-containing precursor, such as PH$_3$, is added to form epitaxial Si:CP film. The flow rates of the silicon-containing precursor and the carbon-containing precursor stay constant during Si:C deposition operation 411 and Si:CP deposition operation 412, in some embodiments. The CDE' unit cycle 415 enables formation of an epitaxial and silicon-containing film 215, such as Si:CP layer 502 as shown in FIG. 5B, at the end of the cycle, in accordance with some embodiments. In CDE' unit cycle 415, GeH$_4$ is not used to assist etching and Cl$_2$ is used as the etchant, instead of HCl. The process temperature for operation 411 and through the cycle of CDE' 415 is maintained constant (isothermal). In some embodiments, the process temperature is in a range from about 400° C. to about 620° C. The process pressure for operation 411 and through the cycle of CDE' 415 is maintained constant (isobaric). In some embodiments, the process pressure is in a range from about 5 Torr to about 300 Torr.

The process time of deposition operation 412 is in a range from about 1 second to about 10 seconds and the process time of etch operation 414 is in a range from about 1 second to about 10 seconds, in some embodiments. The process time for both purge operations 413 and 415 is in a range from about 1 second to about 10 seconds, in some embodiments. By using Cl$_2$, the etch time is greatly reduced from the range of about 40 seconds to about 100 seconds for the process of using HCl and GeH$_4$ described above to the range of about 1 second to about 10 seconds. FIG. 5B shows a Si:CP layer 502 formed over Si:C layer 501. In some embodiments, the thickness of Si:CP layer 502 is in a range from about 1 nm to about 3.5 nm.

Upon the completion of CDE' 415, CDE-1 410 is finished and CDE-i 420 follows to further growing epitaxial and silicon-containing material 215, which is Si:CP for the embodiments of FIGS. 4A-4B. As mentioned above, the epitaxial and silicon-containing material 215 needs to meet the goals of lower resistivity and sufficient carbon concentration. In some embodiments, the N-type dopant (such as P or As) concentration is in a range from about 1E20 atoms/cm$^3$ to about 7E20 atoms/cm$^3$ and the carbon concentration of material 215 is equal to or greater than about 1.2%. Carbon and N-type dopants (such as P) compete to bond with Si to form silicon-containing material 215 doped with carbon and phosphorus. In order to have sufficient P dopants in the silicon-containing material 215 using CDE-i 420 process, which uses Cl$_2$ as an etchant, an N-type dopants (or phosphorus/P) soak is needed.

Figure 5C:
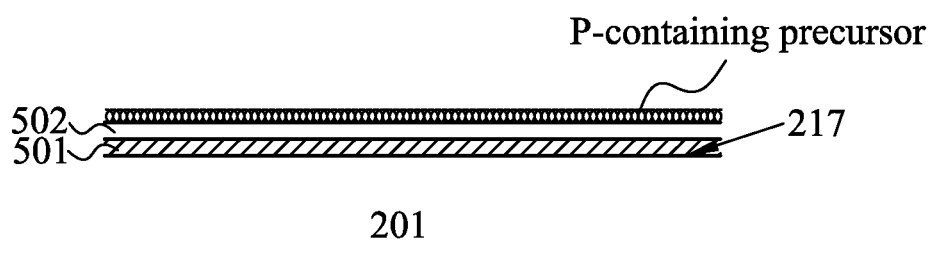

FIG. 4C shows CDE-i 420 starts with a P-soak operation 421, which is followed by a CDE' 415 described above, in accordance with some embodiments. During the P-soak operation 421, a phosphorus-containing precursor, such as PH$_3$ is used to saturate the surface of substrate, including the surface of layer 502 on recesses 210, with the phosphorus-containing precursor, which provides phosphorus. FIG. 5C shows that surface of layer 502 covered with the phosphorus-containing precursor, in some embodiments. By saturating the surface of layer 502 with the phosphorus-containing precursor, sufficient P is incorporated into the silicon-containing material 215 (or Si:CP) along with carbon (C) to meet the target concentration. A carrier gas, such as an inert gas, or a gas non-reactive with the reactants, may be used. The examples of carrier gas used include, but are not limited to, He, Ar, Ne, Xe, and N$_2$. In some embodiments, the process time for the P-soak operation 421 is in a range from about 1 second to about 5 seconds. The P-soak operation 421 is also operated under same temperature and pressure of operation 410, in some embodiments.

Figure 5D:
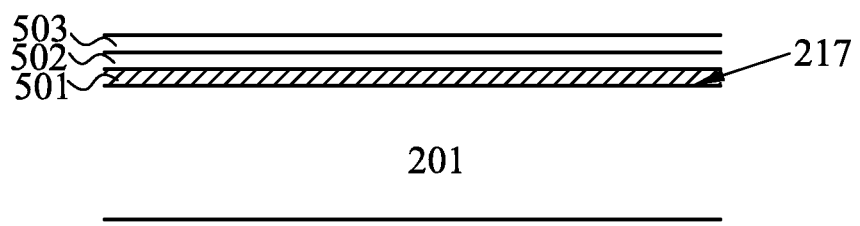
Figure 5E:
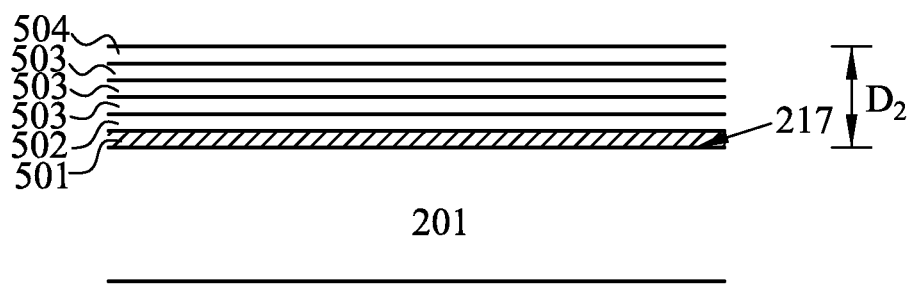

The CDE' 415 following the P-soak operation 421 has been described above. At the end of the CDE' 415, a Si:CP layer 503 is formed over Si:CP layer 502, as shown in FIG. 5D in accordance with some embodiments. Due to the P-soak operation 421 prior to the forming Si:CP layer 503, the P concentration of Si:CP layer 503 is higher than Si:CP layer 502. The CDE-i 420 process is repeated a number of times until the targeted thickness $D_2$ is reached. For example, the CDE-i 420 is repeated 4 times (N=5). FIG. 5E shows the layers over post-etch surface 217 of recess 210, in accordance with some embodiments. FIG. 5E shows four Si:CP layer 503 formed over Si:CP layer 502, which is deposited over Si:C layer 501. In some embodiments, the thickness of Si:CP layer 503 is in a range from about 1 nm to about 3.5 nm.

Figure 6A:
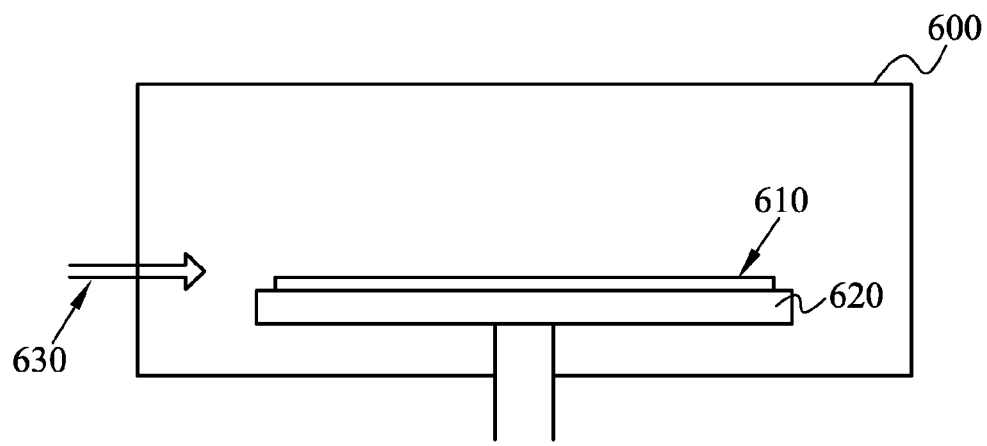
FIG. 6A shows a schematic diagram of a side view a process chamber used to perform an asymmetric cyclic deposition/etch (ACDE) process described above, in accordance with some embodiments.

The process chamber used to perform the ACDE process provides reactive gases to the process chamber from the side to feed the reactive gases over the surface of the wafer. FIG. 6A shows a schematic diagram of a side view a process chamber 600 used to perform an ACDE process described above, in accordance with some embodiments. Wafer 610 sits on a substrate support 620. Reactive gas injectors 630 provide reactive gases from the side of chamber 600 to the surface of substrate 610. The substrate support 620 is configured to rotate to improve the uniformity of the film growth. This is necessary because the process gas is introduced from the side of the process chamber.

Figure 6B:
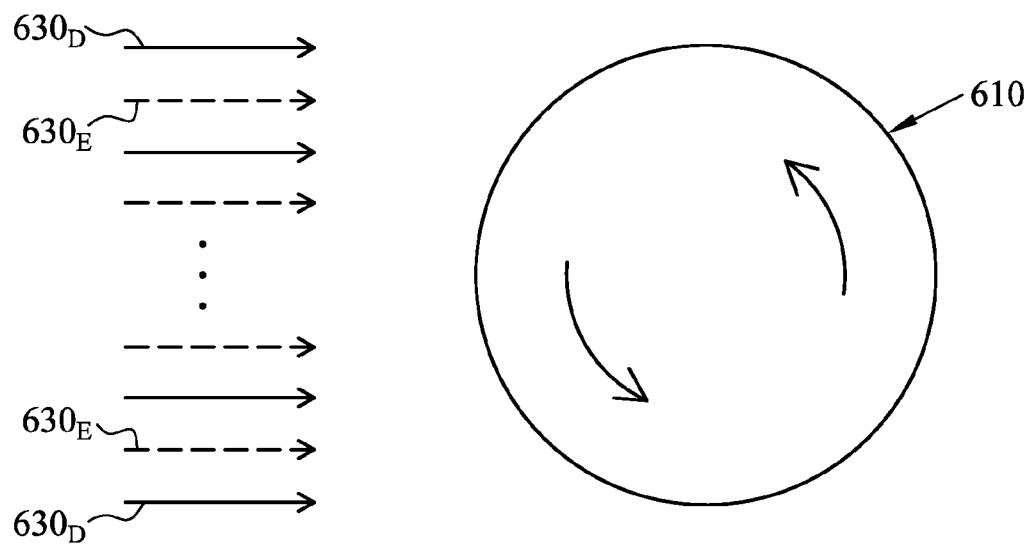
FIG. 6B shows a schematic diagram of a top view of process chamber of FIG. 6A, in accordance with some embodiments.

FIG. 6B shows a schematic diagram of a top view of process chamber 600 of FIG. 6A, in accordance with some embodiments. FIG. 6B show that the gas injectors 630 include deposition gas injectors $630_D$ and etch gas injectors $630_E$, in accordance with some embodiments. FIG. 6B also shows that wafer 610 rotates during the process as noted by the arrows to show the rotating direction, in accordance with some embodiments. An example of a process chamber with such configuration is an Intrepid™ system by ASM International N.V. of Almere, The Netherland. As mentioned above, the $Cl_2$ is more active than HCl in etching the silicon-containing material 215. If a rotation speed used for the HCl process is used, the edge portions of the wafer would have lower deposition rate, which is due to higher etch rate of $Cl_2$ chemistry. Studies show that the deposition uniformity across wafer is improved by increasing wafer rotation speed during process. In some embodiments, the wafer rotation speed for the ACDE process is in a range from about 50 RPM (rounds per minute) to about 120 RPM.

Following the ACDE process, a selective epitaxial growth (SEG) process may be used to deposit additional silicon-containing film to fill the remaining recesses 210, in accordance with some embodiments. Alternatively, the ACDE 400 process described above can be used to fill the remaining recesses 210. The SEG process has a higher growth rate than the ACDE 400 process, in accordance with some embodiments. The SEG process is a selective deposition process and the silicon-containing film formed by this process deposits on epitaxial silicon-containing film, such as layer 215. SEG processes utilize simultaneous deposition and etch. In some embodiments, the surface of the silicon-containing layer 216, which is epitaxial, is leveled with silicon substrate surface 230. In some embodiments, the surface of the silicon-containing layer 216 is above silicon substrate surface 230, as shown in FIG. 2E.

The SEG process is performed in the same process chamber as the ACDE 400 process, in some embodiments. The process gases used are the same as those used for the ACDE 400 process. During the SEG process, the deposition and etch gases are introduced into the process chamber simultaneously. In some embodiments, the process temperature and pressure of the SEG process are the same as those for the ACDE 400 process. The process flow ranges for the reactive gases and carrier gas used for the SEG process are similar to those for the ACDE 400 process, in some embodiments. In some embodiments, the etch gas used for SEG is changed to HCl.

Figure 7:
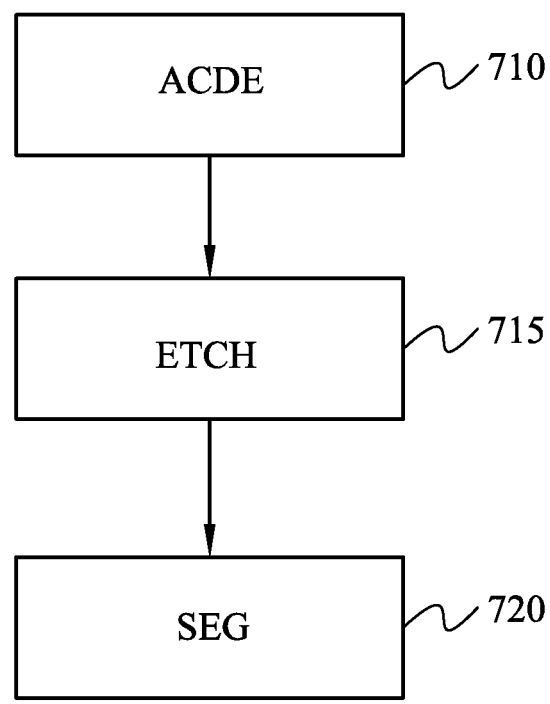
FIG. 7 shows a process flow for forming epitaxial materials in recesses, in accordance with some embodiments.

As mentioned above, HCl or $Cl_2$ may be used as the etchant for the SEG processes. During the formation of the source and drain regions of the NMOS devices, the PMOS regions are covered by a SiN layer, in some embodiments. $Cl_2$ used in the ACDE 400 process seems to change the surface of SiN and worsen the epitaxy selectivity of SEG process to cause particle issues. In some embodiments, a dedicated etch is performed between ACDE 400 and SEG process to resolve the particle issue. FIG. 7 shows a process flow 700 with the dedicated etch 715 between ACDE 710 and SEG 720 described above, in accordance with some embodiments. ACDE 710 is the same as ACDE 400 described above. SEG 720 process has also been described above. The etch process 715 uses either HCl or $Cl_2$ as etch gas. In some embodiments, etch process 715 is performed under the same temperature and pressure as ACDE 710 and SEG 720 (isothermal and isobaric). The etch gas flow rate is in a range from about 20 sccm to about 200 sccm. The etch time is in a range from about 100 seconds to about 900 seconds. Results show that the dedicated etch 715 is able to resolve the particle issue. The etch process likely removes etch residue from $Cl_2$ etch or re-condition the substrate surface to repress or prevent the formation of particles.

In addition to using the dedicated etch 715 described above, studies also show that the etch/deposition (E/D) ratio of the SEG process can control the particle amount caused by using $Cl_2$ during the ACDE 400 process. Using higher E/D ratio can reduce the particles to none. However, using higher E/D ratio also reduces the film formation rate. Therefore, a balance needs to be maintained when choosing the operating E/D ratio. In some embodiments, E/D ratio is defined as a ratio of etch gas flow, such as HCl, to silicon-containing gas, such as MMS, flow. In some embodiments, the E/D ratio is in a range from about 0.03 to about 0.1. Studies show that operating E/D ratios in this range for the SEG process produces Si:CP film without particles and with good throughput.

As mentioned above, method 100 further includes an anneal operation 140 after operation 130, in some embodiments. The anneal operation 140 could be used to activate dopants and/or drive dopants into the lightly-doped-drain (LDD) regions. The thermal anneal may utilize rapid thermal processing (RTP) anneal, spike, anneal, millisecond anneal, laser anneal, or a combination thereof.

In some embodiments, the anneal process utilize a 2-stage pre-heat millisecond anneal. Substrate 102 first undergoes a warm-up and is heated to a temperature in a range from about 400° C. to about 600° C. with a duration in a range from about 2 seconds to about 20 seconds, in some embodiments. The wafer then undergoes a second pre-heat at a temperature in a range from about 700° C. at about 900° C. for a duration in a range from about 1 second to about 20 seconds. During the half point of the second stage preheat, the temperature of the wafer is quickly raised to the peak anneal temperature by millisecond anneal. For example, if the preheat duration during the second stage preheat is 4 seconds, the wafer temperature is raised to peak anneal temperature after 2 seconds of the second stage preheat. Flash anneal lamps, such as xenon (Xe) arc lamps or argon (Ar) arc lamps, may be used to achieve such a rapid temperature rise. The second stage preheat continues for another 2 seconds. The peak temperature for the millisecond anneal is in a range from about 950° C. to about 1200° C. for a duration in a range from about 1 milliseconds (ms) to about 40 ms, in accordance with some embodiments.

In addition to activate the dopants, the thermal anneal 140 drives the N-type dopants, P, from layer 503 into the SiC layer 501 and also into the Si:CP layer 502, which has lower dopants than layers 503. The thermal anneal makes the dopant concentrations in layers 501 and 502 substantially equal to the dopant concentration in layer 503.

Details of a number of exemplary anneal processes are described in U.S. patent application Ser. No. 13/183,909, titled "Methods of Anneal After Deposition of Gate Layers," and filed on Jul. 15, 2011, which is incorporated herein in its entirety. However the process conditions may be modified to fit the needs to the current disclosure.

The usage of the anneal operation 140 to drive dopants into the lightly-doped-drain (LDD) regions can be beneficial to advanced technologies, such fin field-effect transistors (fin-FETs). Detailed description of such application is included in U.S. Patent application No. 61/780,784, titled "Mechanisms for Doping Lightly-Doped-Drain (LDD) Regions of FinFET Devices" and filed on Mar. 13, 2013, which is incorporated herein in its entirety. However the process conditions may be modified to fit the needs to the current disclosure.

The embodiments of mechanisms described above use N-type devices with P as dopants. However, other types of N-type dopants may also be used. In addition, the mechanisms may also be modified to be applied to P-type devices with P-type dopants.

The embodiments of mechanisms for forming source/drain (S/D) regions of field effect transistors (FETs) described uses $Cl_2$ as an etchant during the epitaxial formation of the S/D regions. The mechanisms involve using an asymmetric cyclic deposition and etch (ACDE) process that forms a preparation layer enable epitaxial growth of the following epitaxial layer with transistor dopants. The mechanisms also involve soaking the surface of substrate with dopant-containing precursors to enable sufficient incorporation of transistor dopants during the epitaxial growth of the S/D regions. By using $Cl_2$ as etchants, the mechanisms also enables high throughput of the epitaxial growth of the S/D regions.

In some embodiments, a method of forming an integrated circuit is provided. The method includes forming a plurality of gate structures over a substrate, and removing portions of the substrate to form recesses adjacent to the plurality of gate structures. The method also includes depositing an epitaxial silicon-containing layer in the recesses, and depositing the epitaxial silicon-containing layer uses an asymmetric cyclic deposition and etching (ACDE) process. The ACDE process uses $Cl_2$ an etchant, and the ACDE process includes a first CDE unit cycle (CDE-1) process and a following CDE unit cycle (CDE-i). The first CDE unit cycle and the following CDE unit cycle are different, and the following CDE unit cycle is repeated a number of times until a final thickness is reached.

In some other embodiments, a method of forming an integrated circuit is provided. The method includes forming a plurality of gate structures over a substrate, and removing portions of the substrate to form recesses adjacent to the plurality of gate structures. The method also includes depositing an epitaxial silicon-containing layer in the recesses, and depositing the epitaxial silicon-containing layer uses an asymmetric cyclic deposition and etching (ACDE) process. The ACDE process uses $Cl_2$ an etchant, and the ACDE process includes a first CDE unit cycle (CDE-1) process and a following CDE unit cycle (CDE-i). The first CDE unit cycle and the following CDE unit cycle are different, and the following CDE unit cycle is repeated a number of times until a final thickness is reached. The method further includes depositing another epitaxial silicon-containing layer by performing a selective epitaxial growth (SEG). The SEG involves simultaneous deposition and etch, and wherein a ratio of etch gas to deposition gas is in a range from about 0.03 to about 0.1.

In yet some other embodiments, an integrated circuit is provided. The integrated circuit includes a gate structure disposed over a substrate, and a silicon-containing material structure disposed over a recess adjacent to the gate structure. The silicon-containing material structure includes an epitaxial layer, and the epitaxial layer has a resistivity equal to or less than about 0.6 mΩkm. The epitaxial layer is doped with carbon and phosphorus, and carbon concentration is equal to or greater than about 1.2 atomic percent. Phosphorus concentration is in a range from about $1E20$ atoms/$cm^3$ to about $7E20$ atoms/$cm^3$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
   forming a plurality of gate structures over a substrate;
   removing portions of the substrate to form recesses adjacent to the respective plurality of gate structures; and
   depositing an epitaxial silicon-containing layer in the recesses, wherein depositing the epitaxial silicon-containing layer uses an asymmetric cyclic deposition and etching (ACDE) process, wherein the ACDE process uses $Cl_2$ an etchant, wherein the ACDE process includes a first CDE unit cycle (CDE-1) and a following CDE unit cycle (CDE-i), wherein the CDE-1 and the CDE-i are different, wherein the CDE-i is repeated a number of times until a final thickness is reached, and wherein each deposition process of the ACDE process is separated from any etch processes of the ACDE process by at least one purge process.

2. The method of claim 1, wherein the first CDE unit cycle forms a carbon doped silicon-containing layer.

3. The method of claim 2, wherein the thickness of the carbon doped silicon-containing layer has a thickness in a range from about 1 nm to about 5 nm.

4. The method of claim 1, wherein the following CDE unit cycle that is performed after the first CDE unit cycle starts with a process of saturating surface of the substrate with a transistor-dopant-containing precursor.

5. The method of claim 1, wherein each of the CDE-1 and the CDE-i include a cyclic deposition and etch (CDE) process, and wherein the $Cl_2$ is used in an etch process of the CDE process.

6. The method of claim 5, wherein the etch process of the CDE process is performed for a duration in a range from about 1 second to about 5 seconds.

7. The method of claim 1, wherein the epitaxial silicon containing layer includes a number of layers after the ACDE process is completed, wherein at least one of the number of layers is different from at least another one of the number of layers.

8. The method of claim 1, further comprising:
performing a thermal anneal, wherein the epitaxial silicon-containing layer is substantially uniform after the thermal anneal.

9. The method of claim 8, wherein the thermal anneal is selected from one of rapid thermal processing (RTP) anneal, spike, anneal, millisecond anneal, laser anneal, or a combination thereof.

10. The method of claim 8, wherein the epitaxial silicon-containing layer include carbon and phosphorus as dopant, wherein carbon concentration is equal to or greater than about 1.2 atomic percent, and wherein phosphorus concentration is in a range from about 1E20 atoms/cm$^3$ to about 7E20 atoms/cm$^3$.

11. The method of claim 8, wherein a resistivity of the epitaxial silicon-containing layer is equal to or less than about 0.6 mΩcm.

12. The method of claim 1, wherein the ACDE process is isothermal and isobaric.

13. The method of claim 5, wherein etch process does not use GeH$_4$.

14. The method of claim 1, wherein rotation rate of the substrate during the ACDE process is in a range from about 50 RPM to about 120 RPM.

15. The method of claim 1, further comprising:
depositing another epitaxial silicon-containing layer by performing a selective epitaxial growth (SEG), wherein the SEG involves simultaneous deposition and etch.

16. The method of claim 15, wherein a ratio of etch gas to deposition gas is in a range from about 0.03 to about 0.1.

17. A method of forming an integrated circuit, the method comprising:
forming a plurality of gate structures over a substrate;
removing portions of the substrate to form recesses adjacent to the plurality of gate structures;
depositing an epitaxial silicon-containing layer in the recesses, wherein depositing the epitaxial silicon-containing layer uses an asymmetric cyclic deposition and etching (ACDE) process, wherein the ACDE process uses Cl$_2$ an etchant, wherein the ACDE process includes a first CDE unit cycle (CDE-1) and a following CDE unit cycle (CDE-i), wherein the CDE-1 and the CDE-i are different, wherein the CDE-i is repeated a number of times until a final thickness is reached, and wherein each etch process of each CDE unit cycle follows at least one deposition process of a corresponding CDE unit cycle; and
after depositing the epitaxial silicon-containing layer, depositing another epitaxial silicon-containing layer by performing a selective epitaxial growth (SEG) process, wherein the SEG process involves simultaneous deposition and etch, and wherein a ratio of etch gas to deposition gas is in a range from about 0.03 to about 0.1.

18. The method of claim 17, wherein the ACDE process and the SEG process are performed under isothermal and isobaric conditions.

19. The method of claim 17, further comprising:
performing an etch process after the ACDE process and before performing the SEG, wherein rotation rate of the substrate during the ACDE process is in a range from about 50 RPM to about 120 RPM.

20. A method of forming an integrated circuit, the method comprising:
forming a gate structure over a substrate;
etching the substrate to form a recess adjacent to the gate structure
epitaxially growing over the recess using an asymmetric cyclic deposition and etching (ACDE) process, a silicon-containing material having a resistivity equal to or less than about 0.6 mΩcm, wherein each deposition process of the ACDE process is performed separately from each etch process of the ACDE process; and
doping the silicon-containing material with carbon and phosphorus to a carbon concentration equal to or greater than about 1.2 atomic percent, and a phosphorus concentration in a range from about 1E20 atoms/cm$^3$ to about 7E20 atoms/cm$^3$.

* * * * *